US012756084B1

(12) United States Patent
Tran et al.

(10) Patent No.: US 12,756,084 B1

(45) Date of Patent: Oct. 6, 2026

(54) PRINTED CIRCUIT BOARD TO DIELECTRIC WAVEGUIDE INTERFACE

(71) Applicant: Northrop Grumman Systems Corporation, Falls Church, VA (US)

(72) Inventors: Tan Tran, Redondo Beach, CA (US); Timothy R. LaRocca, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 300 days.

(21) Appl. No.: 18/384,482

(22) Filed: Oct. 27, 2023

(51) Int. Cl.
*H01P 3/16* (2006.01)
*H05K 1/02* (2006.01)

(52) U.S. Cl.
CPC ............. *H01P 3/16* (2013.01); *H05K 1/0237* (2013.01); *H05K 2201/0776* (2013.01)

(58) Field of Classification Search
CPC ................................ H01P 3/16; H05K 1/0237
See application file for complete search history.

(56) References Cited

U.S. PATENT DOCUMENTS 3,683,299 A * 8/1972 Vzyatyshev .............. H01P 3/16 333/248
4,905,013 A * 2/1990 Reindel .................. H01Q 13/02 343/807
8,466,845 B2 6/2013 Elsallal et al.
9,478,842 B1 10/2016 Decrossas et al.
2024/0023230 A1* 1/2024 Berthier ............... H05K 1/0243

OTHER PUBLICATIONS

Zhang et al., Broadband Transition Between Double-Sided Parallel-Strip Line and Coplanar Waveguide, IEEE Microwave and Wireless Components Letters, vol. 17, No. 2, Feb. 2007, 3 Pages.
Dens et al., A PAM4 Dielectric Waveguide Link in 28 nm Cmos, Esscirc 2021 - IEEE 47th European Solid State Circuits Conference (ESSCIRC) | 978-1-6654-3751-6/21/$31.00 @2021 IEEE | DOI: 10.1109/ ESSCIRC53450.2021.9567741, Mar. 30, 2022, 4 Pages.
Zhang et al., Bunny Ear Combline Antennas for Compact Wide-Band Dual-Polarized Aperture Array, IEEE Transactions On Antennas and Propagation, vol. 59, No. 8, Aug. 2011, 5 Pages.
Drawings C1, C2, and C3.

* cited by examiner

*Primary Examiner* — Jeremy C Norris
(74) *Attorney, Agent, or Firm* — Dority & Manning, P.A.

(57) ABSTRACT

A printed circuit board (PCB) interface comprises a coupling device having an impedance control portion. The interface further comprises a dielectric waveguide including a slotted end that receives the coupling device such that the impedance control portion overlaps the dielectric waveguide.

8 Claims, 3 Drawing Sheets

FIG. 2
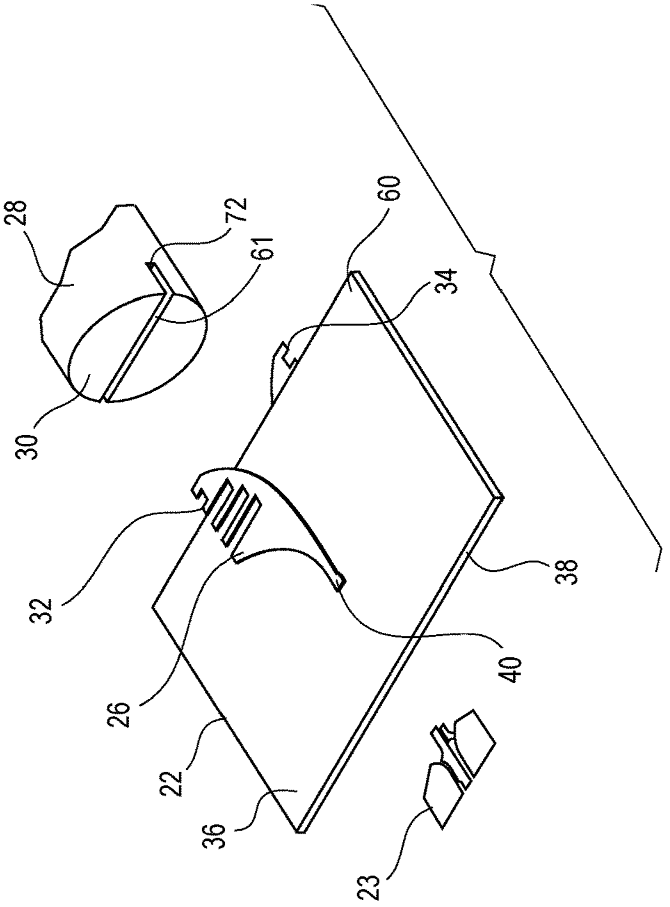
FIG. 1
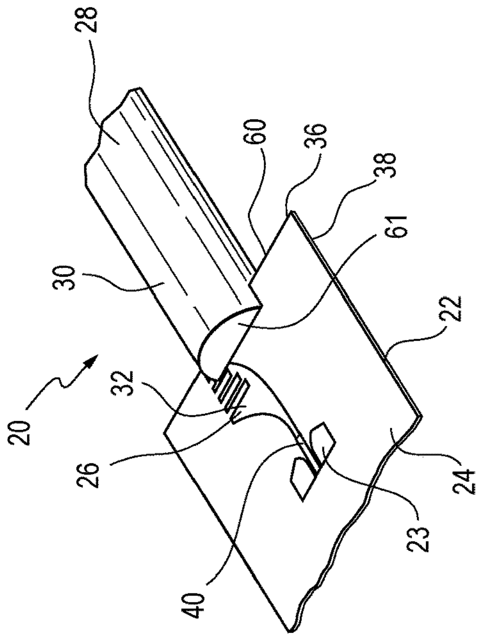
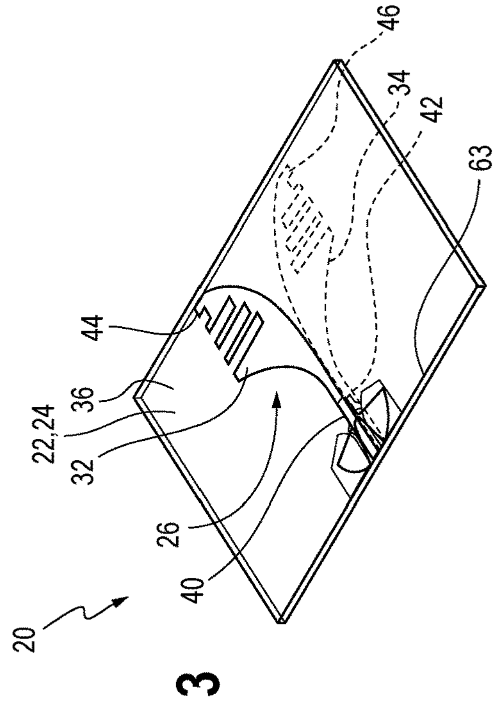
FIG. 3

PRINTED CIRCUIT BOARD TO DIELECTRIC WAVEGUIDE INTERFACE

FIELD OF DISCLOSURE

The present subject matter relates to coupling apparatus, and more particularly to a device for interfacing circuits disposed on a printed circuit board (PCB) to a dielectric waveguide.

BACKGROUND

RF signals propagate down a circular dielectric waveguide (DWG) using an HE11 mode. To use this DWG as a transport medium, an effective low-loss method is needed to couple the signal down the line. Traditionally, dipoles (usually printed) or waveguide-based structures were used for this purpose, but such structures are narrowband or too large to accommodate high density electronics. Also, large structures like dipoles or horns are often expensive to fabricate and require other alignment features to complete the total system design. Typical values prior to the design of more efficient couplers was 10 dB loss per coupler (20 dB loss per system), which was a key limiting factor in the usage of a dielectric waveguide digital transport system.

More particularly, a number of devices have been developed for feeding/launching sub-millimeter electromagnetic energy into and receiving such energy from a dielectric waveguide. A first device comprises a horn-type coupler comprising a horn antenna having a square cross-sectional profile that surrounds an end of a circular dielectric waveguide. The horn is made of metal and interfaces with a metallic waveguide, both of which are relatively expensive. Further, the horn antenna is undesirably large and requires alignment features to locate the end of the dielectric waveguide precisely in the horn. Still further, additional transitional devices are required to transmit the electromagnetic energy with high efficiency.

A dipole-fed assembly comprises a dipole antenna coupled to a circular dielectric waveguide. Such an assembly operates over a relatively narrow band of wavelengths and, as with the horn-type coupler, requires alignment features that position the waveguide in a precise manner relative to the dipole antenna.

A combined horn and lens coupler comprises a metallic waveguide coupled to a dielectric lens. A dielectric waveguide is coupled to the dielectric lens. The coupler is undesirably large due to the use of a metallic waveguide and the metallic waveguide is relatively expensive. Alignment and mounting features are required for the dielectric waveguide and additional transition features are required to connect to electronic components. Still further, the dielectric waveguide is made of polytetrafluoroethylene (PTFE) of specific dimensions, which complicates the fabrication of the dielectric lens.

A PCB-based coupler designed by KU Leuven of Belgium is disclosed in a paper by K. Dens, J. Vaes, S. Ooms, M. Wagner and P. Reynaert, "A PAM4 Dielectric Waveguide Link in 28 nm CMOS," ESSCIRC 2021—IEEE 47th European Solid State Circuits Conference (ESSCIRC), 2021, pp. 479-482, doi: 10.1109/ESSCIRC53450.2021.9567741. This design as shown in FIG. 4 of such paper uses a dielectric waveguide that is "butt pressed" against the end of the PCB. The coupler exhibits a peak loss that limits the high speed digital communications to 10 Gbps at 8 meters.

SUMMARY

According to one aspect, a printed circuit board (PCB) interface comprises a coupling device having an impedance control portion. The interface further comprises a dielectric waveguide including a slotted end that receives the coupling device such that the impedance control portion overlaps the dielectric waveguide.

According to another aspect a printed circuit board (PCB) interface comprises a coupling structure having a substrate, a coplanar waveguide (CPW) transition structure, and an impedance control portion coupled to the CPW transition structure. A dielectric waveguide includes a slotted end that receives the coupling device such that the impedance control portion overlaps the dielectric waveguide.

Other aspects and advantages will become apparent upon consideration of the following detailed description and the attached drawings wherein like numerals designate like structures throughout the specification.

BRIEF DESCRIPTION OF THE DRAWINGS

FIG. 1 is a fragmentary isometric view of an embodiment of a printed circuit board (PCB) interface;

FIG. 2 is a fragmentary exploded isometric view of the PCB interface of FIG. 1;

FIG. 3 is an isometric view of the PCB interface of FIG. 1 with the PCB shown as transparent to assist in understanding the PCB interface;

DETAILED DESCRIPTION

Figure 5:
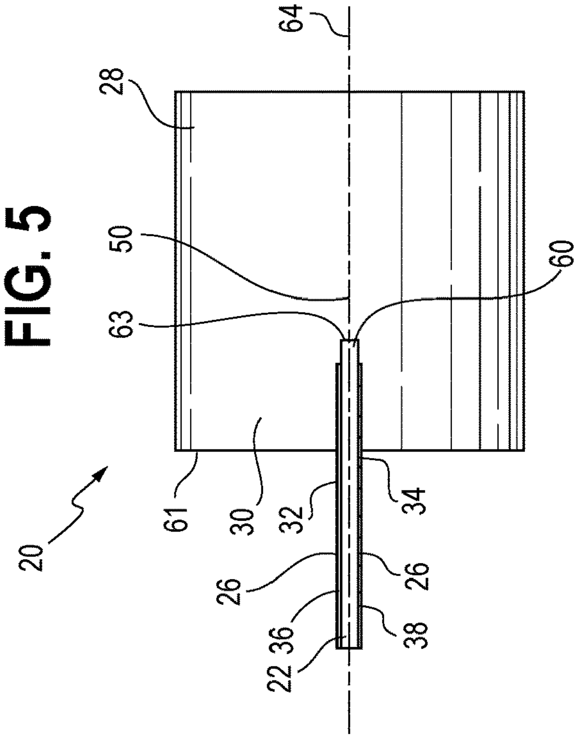
FIG. 5 is a side elevational view of the PCB interface of FIG. 1.

FIGS. 1-6 show an embodiment of a printed circuit board (PCB) interface device 20 that, for the purpose of illustration, comprises a coupling structure having a circuit board substrate 22 and a coplanar waveguide (CPW) transition structure 23 disposed on the substrate 22 and that serves as a transition disposed on a printed circuit board 24. In the illustrated embodiment, the transition structure 23 is via-less and is coupled to an impedance control device, which may (but need not) comprise an antipodal Vivaldi-based impedance taper structure 26. A dielectric waveguide (DWG) 28, which may be circular in cross section, includes a slotted end 30 that receives the PCB interface device 20 as noted in greater detail below.

Figure 4:
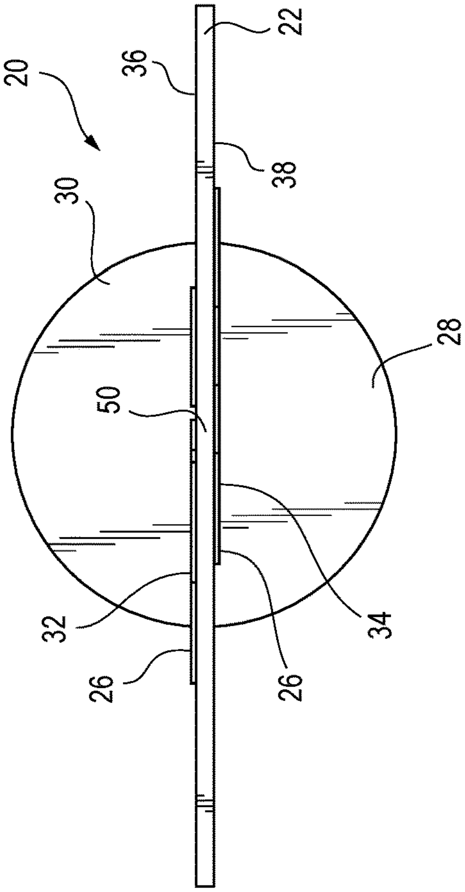
FIG. 4 is a front elevational view of the PCB interface of FIG. 1.

In the illustrated embodiment, the Vivaldi-based impedance taper structure 26 includes two portions in the form of arms 32, 34 that are disposed on opposite faces 36, 38 respectively, of the circuit board substrate 22. As is known, the Vivaldi-based impedance taper arms 32, 34 include proximal ends 40, 42 and distal ends 44, 46, (FIGS. 3 and 6) respectively, wherein the arms 32, 34 diverge from one another (as seen in FIGS. 3 and 6) along curved paths from the proximal ends 40, 42 to the distal ends 44, 46. Further, the arm 34 is a mirror image of the arm 32 (again, as seen in FIGS. 3 and 6) i.e., the arm 34 is substantially or fully symmetric with the arm 32 about a line 50 extending along a length of the substrate 22 midway between the opposite faces 36, 38, as shown in FIGS. 4 and 5.

As seen in FIG. 6, the distal ends 44, 46 are relatively wide compared to the proximal ends 40, 42 and the distal ends 44, 46 include side terminal surfaces 51, 52, respectively, and further terminal surfaces 54, 56, respectively, transverse to the terminal surfaces 50, 52, respectively. Artificial impedance features in the form of combline structures 54, 56 are disposed in the distal ends 44, 46 and intersect the side terminal surfaces 50, 52, respectively.

Figure 6:
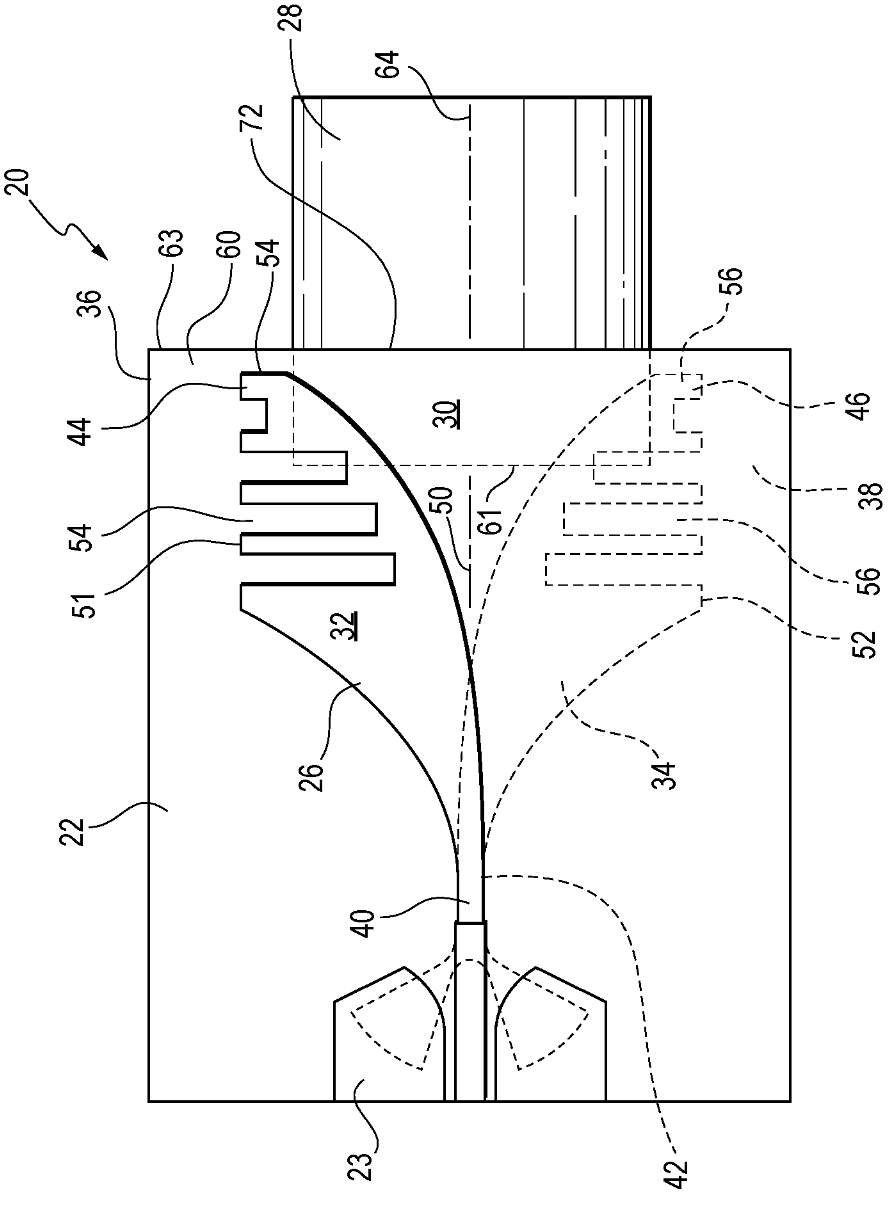
FIG. 6 is a plan view of the PCB interface of FIG. 1.

As best seen in FIGS. 1, 5, and 6, the slotted end 30 is disposed over an end portion 60 of the circuit board substrate 22 overlapping the impedance control device, in the illustrated example, comprising the Vivaldi-based impedance taper structure 26. In the illustrated embodiment, the slotted end 30 fits snugly over the end portion 60 and is secured at a desired overlap length extending between an end 61 of the dielectric waveguide 28 and an end surface 63 of the substrate 22. When so positioned, and as shown in the FIGS., a portion of the dielectric waveguide 28 overlaps the distal ends 44, 46 of the Vivaldi-based impedance taper structure 26 (this overlap is referred to hereafter as an "interface overlap"). The interface overlap may be varied in an iterative manner so as to tune and optimize the transmission characteristics of interface device 20. Specifically, the exact location of where the artificial impedance surfaces are disposed versus how much dielectric waveguide overlaps the substrate 22 is a tunable feature. Thus, changing the impedance taper and/or moving the terminal surfaces 54, 56 result in a variation in transmission loss magnitude. In addition, tight manufacturing tolerances may result in the ability to increase the number of artificial impedance surfaces and thereby obtain a further reduction in transmission loss.

The slotted end 30 is positioned such that a centerline 64 of the dielectric waveguide 28 is substantially or fully coincident with the line 50 (FIGS. 5 and 6). This ensures that the slotted end 30 of the dielectric waveguide 28 equally overlaps the distal ends 44, 46 from side to side so as to minimize losses due to poor modal match. Also, in an embodiment, the slotted end 30 may fully receive the substrate 22 in the sense that the end surface 63 of the substrate 22 abuts an end surface 72 seen in FIGS. 2 and 6 in part defining the slotted end 30, although this need not be the case inasmuch as the surfaces 63, 72 may be spaced from one another. In the latter case, air or one or more adhesive compound(s) may be present in the gap between the end surface 72 and the end surface 63. Also in an embodiment, the substrate 22 may be secured to the dielectric waveguide 28. This may be achieved by any suitable adhesive, bonding agent, or the like. Alternatively or additionally, the substrate 22 may be disposed within the slotted end 30 by a press-fit, a clearance fit, or a transition fit. In any event the length of the overlap has an effect on the performance of the interface device 20.

It should be noted that the antipodal Vivaldi-based impedance taper structure 26 may be replaced by another structure, such as similar type impedance taper structures that radiate using slot modes, including tapered slot antennas and notch antennas. Further, non-antipodal structures (i.e., single-sided as opposed to double-sided PCB structures) can be used but such structures have less symmetric bandwidth around a center frequency.

INDUSTRIAL APPLICABILITY

The PCB interface device 20 converts a PCB signal off a chip to a dielectric waveguide signal (and vice versa). The coupler interface device 20 comprises a coplanar waveguide (CPW) feed directly to/from electronics, and the mode is converted to a parallel plate mode and then, in the illustrated embodiment, to the antipodal Vivaldi impedance taper. This mode conversion is via-less to obtain a simple fabricable design. The Vivaldi impedance taper is overlapped with the dielectric waveguide (DWG). This overlapping region creates a hybrid region where the e-fields of the PCB impedance taper and the dielectric waveguide are in mix. This, in turn, allows the Vivaldi transition to be precisely tapered to the impedance/propagation velocity of the traveling wave in the dielectric waveguide and PCB. This hybrid region allows the fields to see a more gradual (and, thus, beneficial) transition than a "butt" ended attachment of the PTFE or other dielectric waveguide. The taper design can be tuned to impedance match the traveling wave of the DWG to the propagating substrate modes in the hybrid region. Using this overlap method the VSWR/RL of the excited modes have the best values, further reinforcing effectiveness. Prior couplers that exhibit what is considered to be "good" coupling may have weak return loss. The interface disclosed herein has strong return loss as well.

This low loss match allows for longer range in the system and provides for higher electronic density as there is less interference from RF leakage.

For example, the interface disclosed herein is believed to be capable of a peak response of −2 dB with 45 GHz of −2.5 dB bandwidth. In the center of the band, it is believed that a flatter in-band response (approximately −6 dB slope due to use of PCB interface devices 20 at both ends of the dielectric waveguide 28 to undertake transmit and receive functions over the waveguide ends) can be achieved to allow high speed digital communications to reach, for example, 10-25 Gbps with at least a range of e.g., 16 m. Inasmuch as digital electronics can only typically compensate for a −10 dB slope over the band, the low loss of the interface combined with the in-band flatness can improve system performance versus prior couplers.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

We claim:

1. A printed circuit board (PCB) interface, comprising:

a coupling device having an impedance control portion; and a dielectric waveguide including a slotted end that receives the coupling device such that the impedance control portion overlaps the dielectric waveguide.

2. The PCB interface of claim 1, wherein the impedance control portion comprises an antipodal Vivaldi-based impedance taper.

3. A printed circuit board (PCB) interface comprising:

a coupling device having an impedance control portion; and a dielectric waveguide including a slotted end that receives the coupling device such that the impedance control portion overlaps the dielectric waveguide wherein the impedance control portion comprises an artificial impedance structure.

4. The PCB interface of claim 3, wherein the artificial impedance structure comprises a combline structure.

5. A printed circuit board (PCB) interface, comprising:

a coupling structure having a substrate, a coplanar waveguide (CPW) transition structure, and an impedance control portion coupled to the CPW transition structure; and a dielectric waveguide including a slotted end that receives the coupling device such that the impedance control portion overlaps the dielectric waveguide.

6. The PCB interface of claim 5, wherein the impedance control portion comprises an antipodal Vivaldi-based impedance taper.

7. A printed circuit board (PCB) interface, comprising:

a coupling structure having a substrate, a coplanar waveguide (CPW) transition structure, and an impedance control portion coupled to the CPW transition structure; and a dielectric waveguide including a slotted end that receives the coupling device such that the impedance control portion overlaps the dielectric waveguide;

wherein the impedance control portion comprises an antipodal Vivaldi-based impedance taper comprising an artificial impedance structure.

8. The PCB interface of claim 7, wherein the artificial impedance structure comprises a combline structure.

* * * * *